United States Patent
Zhou et al.

(10) Patent No.: US 11,689,168 B1
(45) Date of Patent: Jun. 27, 2023

(54) LOW NOISE TRANS-IMPEDANCE AMPLIFIER

(71) Applicant: Beken Corporation, Pudong New District (CN)

(72) Inventors: Haiyan Zhou, Pudong New District (CN); Ronghui Kong, Pudong New District (CN); Jiazhou Liu, Pudong (CN)

(73) Assignee: Beken Corporation, Shanghai (CN)

( * ) Notice: Subject to any disclaimer, the term of this patent is extended or adjusted under 35 U.S.C. 154(b) by 0 days.

(21) Appl. No.: 17/662,200

(22) Filed: May 5, 2022

(30) Foreign Application Priority Data

Apr. 4, 2022 (CN) .......................... 202210352453.5

(51) Int. Cl.
*H03F 3/45* (2006.01)

(52) U.S. Cl.
CPC ... *H03F 3/45269* (2013.01); *H03F 2200/294* (2013.01)

(58) Field of Classification Search
CPC ................................................ H03F 3/45269
See application file for complete search history.

(56) References Cited

U.S. PATENT DOCUMENTS

| 4,462,002 A * | 7/1984 | Schade, Jr. ............. G05F 3/267 330/261 |
| 4,988,954 A * | 1/1991 | Stern ..................... H03F 3/3001 330/264 |
| 2008/0036537 A1* | 2/2008 | Syed ........................ H03F 1/26 330/253 |
| 2008/0079494 A1* | 4/2008 | Aram ....................... H03F 1/26 330/277 |
| 2012/0262235 A1* | 10/2012 | Hoogzaad ............. H03F 1/3211 330/252 |
| 2021/0184639 A1* | 6/2021 | Bronzi ................ H03F 3/45071 |

* cited by examiner

*Primary Examiner* — Patricia T Nguyen
(74) *Attorney, Agent, or Firm* — Schwegman Lundberg & Woessner, P.A.

(57) ABSTRACT

A trans-impedance amplifier (TIA) may include an input stage and an output driving stage. The input stage may include a pair of input PMOS transistors, a pair of input NMOS transistors, and a pair of differential voltage input nodes. The output driving stage may include a pair of output circuits, each may include a first pair of PMOS and NMOS transistors electrically connected in parallel, a second pair of PMOS and NMOS transistors electrically connected in series, a pair of capacitors electrically connected in series, a differential output node, a third PMOS transistor, and a fourth pair of NMOS transistors cross-coupled between the pair of output circuits of the output driving stage. The structure can lead to a reduced noise level and a reduced peak transient current level of the TIA.

16 Claims, 3 Drawing Sheets

LOW NOISE TRANS-IMPEDANCE AMPLIFIER

CROSS REFERENCE TO RELATED APPLICATIONS

This application claims priority to and incorporates by reference Chinese Patent Application No. 202210352453.5 filed 4 Apr. 2022.

TECHNICAL FIELD

The present application relates to a trans-impedance amplifier (TIA), particularly to a low noise TIA.

BACKGROUND

TIAs are widely used in electronic devices such as photoelectric receivers and op-amps. Typically, a receiver front end (RXFE) of a photoelectric receiver may include a low noise amplifier (LNA), a mixer, and a TIA, for example, and noise incurred by the TIA may greatly affect the performance of the receiver. Therefore, a new TIA with reduced noise and peak transient current becomes highly desirable.

SUMMARY

According to an embodiment, a trans-impedance amplifier (TIA) comprises: an input stage comprising a first and a second input PMOS transistors, a first and a second load NMOS transistors, and a first and a second differential voltage input nodes; and an output driving stage comprising a first and a second output circuits each comprising: a first pair of PMOS and NMOS transistors electrically connected in parallel; a second pair of PMOS and NMOS transistors electrically connected in series; a pair of capacitors electrically connected in series; a differential output node electrically connected to a drain of a NMOS transistor of the second pair of PMOS and NMOS transistors; a third PMOS transistor electrically connecting a gate of the NMOS transistor of the second pair of PMOS and NMOS transistors to a drain of the first or the second input PMOS transistors of the input stage; and a fourth pair of NMOS transistors cross-coupled between the first and the second output circuits of the output driving stage.

According to an embodiment, a method of amplifying a voltage signal comprises: receiving differential input voltages with a first and a second differential voltage input nodes of a trans-impedance amplifier (TIA), wherein the TIA includes an input stage comprising a first and a second input PMOS transistors; a first and a second load NMOS transistors, wherein drains of the first and the second input PMOS transistors and drains of the first and the second load NMOS transistors are electrically connected; and a first and a second differential voltage input nodes respectively electrically connected to gates of the first and the second input PMOS transistors; and an output driving stage comprising a first and a second output circuits each comprising a first pair of PMOS and NMOS transistors electrically connected in parallel; a second pair of PMOS and NMOS transistors electrically connected in series: a pair of capacitors electrically connected in series; a differential output node electrically connected to a drain of a NMOS transistor of the second pair of PMOS and NMOS transistors; and a third PMOS transistor electrically connecting a gate of the NMOS transistor of the second pair of PMOS and NMOS transistors to a drain of the first or the second input PMOS transistors of the input stage; and a fourth pair of NMOS transistors cross-coupled between the input stage and the output driving stage; amplifying the differential input voltages by the input stage and the output driving stage to create amplified differential output voltages; and outputting the amplified differential output voltages to the first and the second differential output nodes.

BRIEF DESCRIPTION OF THE DRAWINGS

Non-limiting and non-exhaustive embodiments of the present application are described with reference to the following figures, wherein like reference numerals refer to like parts throughout the various views unless otherwise specified.

DETAILED DESCRIPTION OF THE ILLUSTRATED EMBODIMENTS

Various aspects and examples of the application will now be described. The following description provides specific details for a thorough understanding and enabling description of these examples. Those skilled in the art will understand, however, that the application may be practiced without many of these details.

Additionally, some well-known structures or functions may not be shown or described in detail, so as concise purpose and to avoid unnecessarily obscuring the relevant description.

The terminology used in the description presented below is intended to be interpreted in its broadest reasonable manner, even though it is being used in conjunction with a detailed description of certain specific examples of the application. Certain terms may even be emphasized below, however, any terminology intended to be interpreted in any restricted manner will be overtly and specifically defined as such in this Detailed Description section. Hereinafter, "PM" or "MP" may represent PMOS transistors, and "NM" or "MN" may represent NMOS transistors.

Without loss of generality, reference will be made to illustrative embodiments by taking a TIA and a RXFE including the TIA as example. Those of ordinary skills in the art understand that this is only to describe the application clearly and adequately, rather than limit the scope of the application, which is defined by the appended claims.

Figure 1:
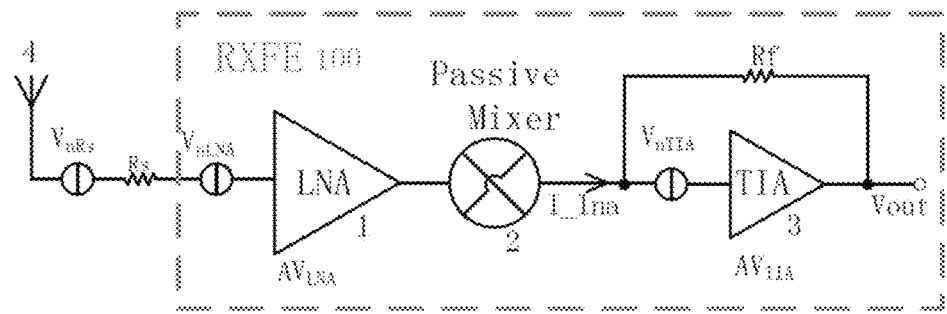
FIG. 1 is a drawing illustrating a RXFE including a TIA according to an embodiment.

FIG. 1 is a drawing illustrating a RXFE 100 of a receiver according to an embodiment of the application. As shown in FIG. 1, the RXFE 100 of the receiver (e.g., a photoelectric receiver not shown) includes an LNA 1, a mixer 2 (e.g., a passive mixer), and a TIA 3, which are all connected in series. The RXFE 100 also includes a feedback resistor Rf that is electrically connected to the TIA 3 in parallel. In some embodiments, an antenna 4 is electrically connected to the LNA 1 of the RXFE 100. Rs represents a parasitic equivalent resistor on a connection line.

The LNA 1 normally works at a high frequency (HF), while the TIA 3 normally works at a medium frequency (MF) or a low frequency (LF). For example, the LNA 1 works at a higher frequency than the TIA 3. For example, the LNA 1 receives a HF voltage signal $V_{nLNA}$ and outputs to the mixer 2 a HF current signal, which is thus transformed by the mixer 2 into a MF or LF current signal $I_{LNA}$ that is output to the TIA 3. After that, the TIA 3 transforms the current signal $I_{LNA}$ into a MF or LF voltage signal $V_{out}$ (e.g., $V_{out}=I_{LNA}*R_f$) and outputs the voltage signal $V_{out}$ to a following circuit (a filter, for example) to make further operations.

The total noise level of RXFE 100 of the receiver is mainly determined by both the LNA 1 and the TIA 3, e.g., in a situation that the mixer 2 is passive. Thus, the total noise level of RXFE 100 can be greatly suppressed by reducing the noise incurred by the TIA 3.

Referring to Equation (1) as shown below. $F_{total}$ represents a total noise factor of the RXFE 100, $V_{nLNA}$ represents an input voltage of the LNA 1, $V_{nTIA}$ represents an input voltage of the TIA 3. $AV_{LNA}$ represents an open loop gain of the LNA 1, and Rs represents the parasitic equivalent resistor on the connection line. Rs may cause a heat noise, which may greatly affect the noise level of the RXFE 100 and can be simulated by an equivalent noise voltage $V_{nRs}$. For example, $V_{nRs}=4kTR_s$, here k is a Boltzmann constant, and T is a Kelvins temperature.

$$F_{total} = \frac{V_{nLNA}^2 + V_{nTIA}^2/AV_{LNA}^2 + 4kTR_S}{4kTR_S} \quad (1)$$

Typically, several operational amplifiers may be used in a receiver, and may cause cumulative current changes to a great extent, which may result in instability or even shocks in the system during conversion processes.

Figure 2:
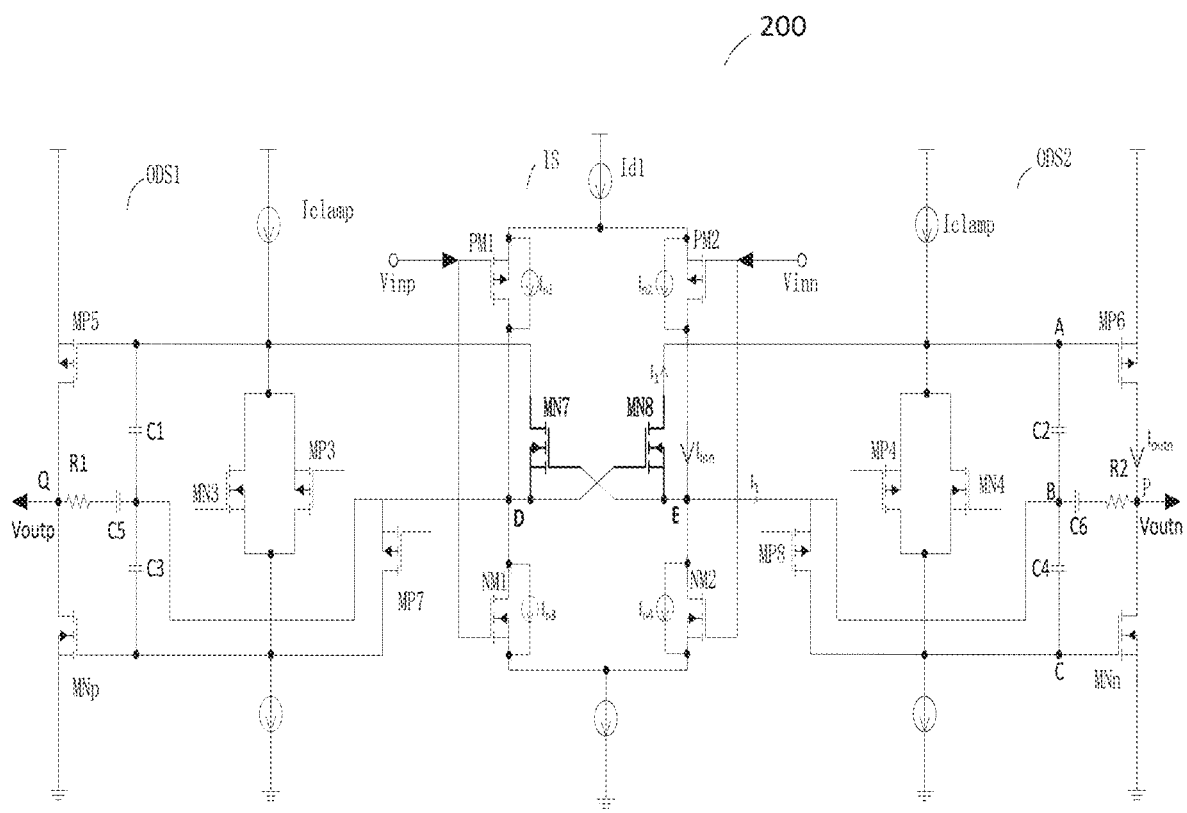
FIG. 2 is a circuit diagram illustrating a TIA according to an embodiment.

FIG. 2 is a circuit diagram illustrating a TIA 200 according to another embodiment. The TIA 200 includes a first stage (e.g., an input stage, "IS") and a second stage (e.g., an output driving stage, "ODS"). The first stage of the TIA 200 includes a pair of differential input PMOS transistors PM1 and PM2, a pair of differential input NMOS transistors NM1 and NM2, and a pair of differential voltage input nodes $V_{inp}$ and $V_{inn}$ to receive differential input voltages (e.g., from another circuit).

In some embodiments, the $V_{inp}$ node is electrically connected to gates of both the PM1 and NM1, and thus can supply an input voltage $V_{inp}$ to the gates of both the PM1 and NM1. The $V_{inn}$ node is electrically connected to gates of both the PM2 and NM2, and thus can supply an input voltage $V_{inn}$ to the gates of both the PM2 and NM2.

In some embodiments, sources of the pair of PM1 and PM2 of the first stage (IS) are electrically connected to a common point S, and may receive a DC bias current $I_{d1}$ to ensure the first stage to work at a suitable current working condition. In some embodiments, sources of the pair of NM1 and NM2 of the first stage are electrically connected to a common point T, which can be grounded.

In some embodiments, drains of PM1 and NM1 are electrically connected to a common point D, and drains of the PM2 and the NM2 are electrically connected to a common point E. Thus, the pair of PM1 and PM2 as well as the pair of NM1 and NM2 of the first stage can determine the total gain of the first stage of the TIA 200.

As shown in FIG. 2, the second stage (ODS) of the TIA 200 includes a pair of a first output circuit (ODS1) and a second output circuit (ODS2) respectively including differential output nodes $V_{outp}$ and $V_{outn}$ to output the amplified differential voltages to another circuit. Both of the ODS1 and the ODS2 of the second stage may receive a DC bias current $I_{clamp}$ that may ensure the second stage to work at a suitable current working condition.

The ODS1 may include a pair of MP3 and MN3. The drain of MN3 and the source of MP3 are electrically connected to a common point F, and can receive the DC bias $I_{clamp}$. The source of MN3 and the drain of MP3 are electrically connected to a common point H.

The ODS1 also may include a pair of capacitors C1 and C3 that are electrically connected in series between the common points F and H.

The ODS1 also may include a pair of MP5 and MNp. The gate of PM5 is electrically connected to the common point F, drains of MP5 and MNp are electrically connected to a common point Q, and the gate of MNp is electrically connected to the common point H.

The ODS1 also may include a resistor R1 and a capacitor C5 electrically connected in series between the common points Q and D, the D being electrically connected between the capacitors C1 and C3. R1, C1, C3 and C5 can provide a miller compensation to the positive output node $V_{outp}$ of the ODS1.

The ODS1 also may include a MP7 electrically connected between the common points H and D. The source of MP7 is electrically connected to the common point D, and the drain of MP7 is electrically connected to the common point H.

The ODS1 and ODS2 have similar structures. In some embodiments, the ODS2 may include a pair of MP4 and MN4. The drain of MN4 and the source of MP4 are electrically connected to a common point A, and can receive the DC bias $I_{clamp}$. The source of MN4 and the drain of MP4 are electrically connected to a common point C.

The ODS2 also may include a pair of capacitors C2 and C4 that are electrically connected in series between the common points A and C.

The ODS2 also may include a pair of MP6 and MNn. The gate of MP6 is electrically connected to the common point A, drains of MP6 and MNn are electrically connected to a common point P, and the gate of MNn is electrically connected to the common point C.

The ODS2 also may include a resistor R2 and a capacitor C6 electrically connected in series between the common points P and E, the E being electrically connected between the capacitors C2 and C4. R2, C2, C4 and C6 can provide a miller compensation to the negative output node $V_{outn}$ of the ODS1.

The ODS2 also may include a MP8 electrically connected between the common points C and E. The source of MP8 is electrically connected to the common point E, and the drain of MP8 is electrically connected to the common point C.

As shown in FIG. 2, both of the pair of ODS1 and ODS2 of the second stage may receive a DC bias current $I_{clamp}$ to ensure the second stage to work at a suitable current working condition. The ODS1 and the ODS2 of the second stage may further amplify the signals (e.g., differential voltage signals) that already have been amplified by the first stage, and may output the further amplified signals to the pair of differential output nodes $V_{outp}$ and $V_{outn}$ in order to output to a following circuit (such as a filter).

In FIG. 2, $I_{d1}$ represents a bias current supplied to the first stage, and $I_{n1}$, $I_{n2}$, $I_{n3}$, and $I_{n4}$ respectively represent thermal noise currents passing through the input transistors PM1, PM2, NM3, and NM4, as shown below:

$$I_{n1}^2 = 4kT\gamma g_{mp1}$$

-continued $$I_{n2}^2 = 4kT\gamma g_{mp2}$$

$$I_{n3}^2 = 4kT\gamma g_{mp3}$$

$$I_{n4}^2 = 4kT\gamma g_{mp4}$$

Referring to Equation (2), as shown below, DC bias currents on the input transistors PM1, PM2, NM3, and NM4 are the same, i.e., $g_{mp1}=g_{mp2}=g_{mp}$, $g_{mn3}=g_{mn4}=g_{mn}$, $I_{n1}^2=I_{n2}^2=4kT\gamma g_{mp}$, $I_{n3}^2=I_{n4}^2=4kT\gamma g_{mn}$, thus, the noise voltage equivalent to the input end is:

$$V_n^2 = \frac{(4kT\gamma g_{mp} + 4kT\gamma g_{mn})}{(g_{mn} + g_{mp})^2} = \frac{4kT\gamma}{g_{mn} + g_{mp}} \quad (2)$$

The structure of the TIA 200 with the pair of input NMOS transistors NM3 and NM4 can reduce the equivalent input thermal noise voltage under the same DC bias current. Therefore, the TIA 200 may incur a reduced noise voltage to the RXFE, and thus may reduce the total noise level of the RXFE.

In some embodiments, the TIA 200 additionally includes a pair of NMOS transistors MN7 and MN8, which are electrically cross connected between the input stage and the output stage.

The MN7 is electrically connected between the common points D and F, with the source of the MN7 electrically connected to the common point D, the drain of the MN7 electrically connected to the common point F, and the gate of the MN7 electrically connected to the common point E.

The MN8 is electrically connected between the common points E and A, with the source of the MN8 electrically connected to the common point E, the drain of the MN8 electrically connected to the common point A, and the gate of the MN8 electrically connected to the common point D.

Referring to the ODS2 side of FIG. 2, for example, under different working conditions, the MN8 and the MP8 may take turns to be on (in a conducting state) so as to provide variable charge and discharge currents, which are adjustable.

In case that the differential signal inputs $V_{inn}$ and $V_{inp}$ are high and low respectively, the gate voltage $V_D$ at the MN8 will be high and MN8 will be on; the source voltage $V_E$ at the MP8 will be low, and the MP8 will be off. At this point, a part of the current $I_{inn}$ will flow to the MN4, and another part $I_1$ of the current $I_{inn}$ will flow to the MN8.

When the $V_{inn}$ starts to decrease from high to low (and the $V_{inp}$ starts to increase from low to high), the drastic change of the current $I_{inn}$ will cause charging the C2 through the MN8 path, and then will cause the $V_A$ to rise rapidly, while the MP8 path is still off. In this way, the change of the current $I_{inn}$ does not directly affect the charging of the C4, and the $V_C$ normally rises rather than rising rapidly.

When the $V_{inc}$ continues to decrease, the change of the $I_{inn}$ will slow down, the $V_C$ will rise, the $V_D$ will decrease, the $V_E$ will rise, so that the MN8 will be off, the MP8 will be on, the changing $I_{inn}$ will start to charge the C4. The slow change of the $I_{inn}$ does not greatly affect the charge on the C4, might only make the $V_C$ slightly higher, while the $V_C$ is always less than the $V_A$. Thus, the output path between the NMOS and PMOS tubes will not be in a complete on state (or a completely conducting state), and accordingly no large current will appear.

In case that the differential signal inputs $V_{inn}$ and $V_{inp}$ are low and high respectively, the gate voltage $V_D$ at the MN8 will be low and the MN8 will be off; the source voltage at the MP8 will be high and the MP8 will be on. At this point, a part of the current $I_{inn}$ will flow to the MN4 and another part $I_1$ of the current $I_{inn}$ will flow to the MP8.

When the $V_{inn}$ starts to increase from low to high (the $V_{inp}$ starts to decrease from high to low), the drastic change of the current $I_{inn}$ will cause discharging the C4 through the MP8 path, and then will cause the $V_C$ to decrease rapidly, while the MN8 path is still off. In this way, the change of the current $I_{inn}$ does not directly affect the charging of the C2, the $V_A$ normally decreases rather than decreasing quickly. This ensures that during the entire process of the $V_{inc}$ changing from low to high process, the $V_C$ is always less than the $V_A$. Thus, the output path between the NMOS and PMOS tubes will not be in a complete on state (or a completely conducting state), and accordingly no large current will appear.

Figure 3:
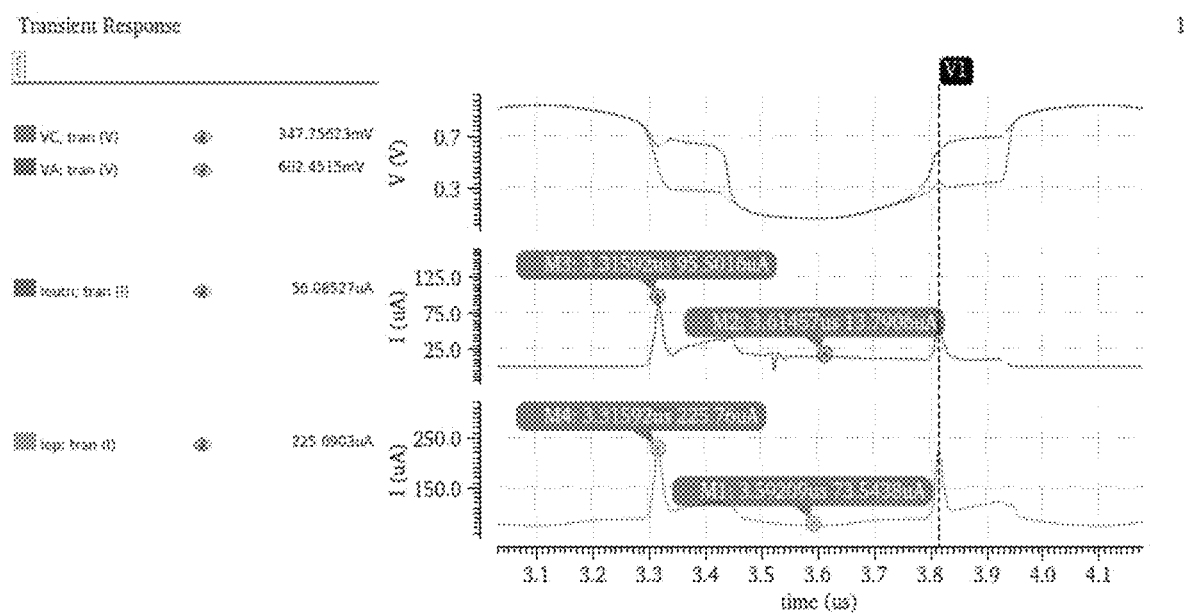
FIG. 3 is a simulation waveform diagram illustrating a waveform generated by a TIA according to an embodiment.

FIG. 3 is a waveform diagram illustrating a waveform generated by the TIA 200 according to an embodiment. As can be seen from FIG. 3, the $V_C$ is always less that the $V_A$, which ensures that there will be no "complete on" (or complete conducting state) between the NMOS and PMOS tubes of the output branch of the TIA 200. The minimum and maximum currents of $I_{outm}$ are 14 uA and 96 uA respectively, while the maximum and minimum currents of the operational amplifiers are 74 uA and 226 uA respectively, thus the instability and oscillations of the system caused by the current changes are effectively reduced. In this way, the structure can lead to a reduced level of noise level and a reduced level of peak transient current of the TIA.

Figure 4:
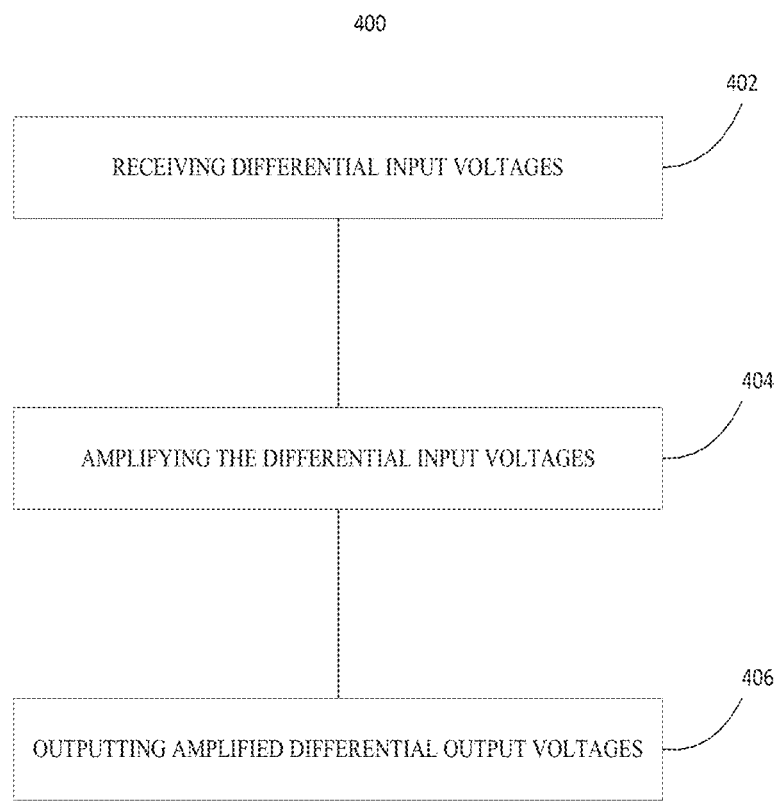
FIG. 4 is a flowchart illustrating a method of low noise amplification.

FIG. 4 is a flowchart illustrating a method 400 of low noise amplification by using a TIA (e.g., TIA 200 as shown in FIG. 2) including a first stage (e.g., an input stage) and a second stage (e.g., an output driving stage). In an embodiment, in block 402, receiving differential input voltages (e.g., from outside) as an input signal by a pair of differential voltage input nodes $V_{inp}$ and $V_{inn}$ in the first stage of the TIA, in block 404, amplifying the differential input voltages by both the first stage and the second stage of the TIA to create amplified differential output voltages, and in block 406, outputting the amplified differential output voltages to a pair of differential output nodes $V_{outp}$ and $V_{outn}$ in the second stage of the TIA to obtain an amplified signal with reduced noise level and reduced peak transient current level as discussed above.

Features and aspects of various embodiments may be integrated into other embodiments, and embodiments illustrated in this document may be implemented without all of the features or aspects illustrated or described.

One skilled in the art will appreciate that although specific examples and embodiments of the system and methods have been described for purposes of illustration, various modifications can be made without deviating from the spirit and scope of the present application. Moreover, features of one embodiment may be incorporated into other embodiments, even where those features are not described together in a single embodiment within the present document. Accordingly, the application is described by the appended claims.

What is claimed is:

1. A trans-impedance amplifier (TIA) (200) comprising:
   an input stage comprising a first and a second input PMOS transistors (PM1, PM2), a first and a second load NMOS transistors (NM1, NM2), and a first and a second differential voltage input nodes ($V_{inp}$, $V_{inn}$); and
   an output driving stage comprising a first and a second output circuits (ODS1, ODS2) each comprising:

a first pair of PMOS and NMOS transistors (MP3, MN3) electrically connected in parallel;

a second pair of PMOS and NMOS transistors (MP5, MNp) electrically connected in series;

a pair of capacitors (C1, C3) electrically connected in series;

a differential output node ($V_{outp}$) electrically connected to a drain of a NMOS transistor (MNp) of the second pair of PMOS and NMOS transistors;

a third PMOS transistor (MP7) electrically connecting a gate of the NMOS transistor of the second pair of PMOS and NMOS transistors to a drain of the first or the second input PMOS transistors (PM1, PM2) of the input stage; and a fourth pair of NMOS transistors (MN7, MN8) cross-coupled between the first and the second output circuits (ODS1, ODS2) of the output driving stage.

2. The TIA of claim 1, wherein a first NMOS transistor (MN7) of the fourth pair of NMOS transistors is electrically connected in parallel with a first capacitor (C1) of the pair of capacitors (C1, C3) in the first output circuit (ODS1), and wherein a second NMOS transistor (MN8) of the fourth pair of NMOS transistors is electrically connected in parallel with a first capacitor (C2) of the pair of capacitors (C2, C4) in the second output circuit (ODS2).

3. The TIA of claim 2, wherein a gate of the first NMOS transistor (MN7) of the fourth pair of NMOS transistors is electrically connected to a source of the second NMOS transistor (MN8) of the fourth pair of NMOS transistors.

4. The TIA of claim 2, wherein a gate of the second NMOS transistor (MN8) of the fourth pair of NMOS transistors is electrically connected to a source of the first NMOS transistor (MN7) of the fourth pair of NMOS transistors.

5. The TIA of claim 1, wherein the first pair of PMOS and NMOS transistors, the second pair of PMOS and NMOS transistors, and the pair of capacitors are electrically connected in parallel in the output driving stage.

6. The TIA of claim 1, wherein a source of the third PMOS transistor (PM7) is electrically connected a drain of the first or the second input PMOS transistor (PM1) in the output driving stage.

7. The TIA of claim 1, wherein a drain of the third PMOS transistor (MP7) is electrically connected the gate of the NMOS transistor (MNp) of the second pair of PMOS and NMOS transistors in the output driving stage.

8. The TIA of claim 1, wherein each of the first and the second output circuits of the output driving stage comprises a resistor (R1) and a third capacitor (C5) electrically connected in series and between a first and a second common points (D, Q), the first common point (D) being electrically connected between the pair of capacitors (C1, C3) of the output driving stage and electrically connected to a drain of the first or the second input PMOS transistor (PM1) of the input stage, and the second common point (Q) being electrically connected to the differential output node ($V_{outp}$).

9. The TIA of claim 1, wherein gates of the first input PMOS transistor (PM1) and the first load NMOS transistor (NM1) are electrically connected in common to the first differential voltage input node (Vinp) in the input stage.

10. The TIA of claim 1, wherein gates of the second input PMOS transistor (PM2) and the second load NMOS transistor (NM2) are electrically connected in common to the second differential voltage input node (Vinn) in the input stage.

11. The TIA of claim 1, wherein an input DC bias current ($I_{d1}$) is provided to the first and the second input PMOS transistors of the input stage.

12. The TIA of claim 11, wherein the input DC bias current is provided to sources of the first and the second input PMOS transistors of the input stage.

13. The TIA of claim 1, wherein an output DC bias current ($I_{clamp}$) is provided to the first pair of PMOS and NMOS transistors (MP3, MN3) of each of the first and the second output circuits in the output driving stage.

14. The TIA of claim 13, wherein the output DC bias current is provided to a source of the PMOS transistor (MP3) and a drain of the NMOS transistor (MN3) of the first pair of PMOS and NMOS transistors that are electrically connected in common.

15. The TIA of claim 1, wherein a drain of the PMOS transistor (MP3) and a source of the NMOS transistor (MN3) of the first pair of PMOS and NMOS transistors of the output driving stage are electrically connected in common to a gate of the NOMS transistor (MNp) of the second pair of PMOS and NMOS transistors in the output driving stage.

16. A method (400) of amplifying a voltage signal comprising:

receiving differential input voltages with a first and a second differential voltage input nodes of a transimpedance amplifier (TIA), the TIA including an input stage comprising a first and a second input PMOS transistors; a first and a second load NMOS transistors, wherein drains of the first and the second input PMOS transistors and drains of the first and the second load NMOS transistors are electrically connected; and a first and a second differential voltage input nodes respectively electrically connected to gates of the first and the second input PMOS transistors; and an output driving stage comprising a first and a second output circuits each comprising a first pair of PMOS and NMOS transistors electrically connected in parallel; a second pair of PMOS and NMOS transistors electrically connected in series; a pair of capacitors electrically connected in series; a differential output node electrically connected to a drain of a NMOS transistor of the second pair of PMOS and NMOS transistors; and a third PMOS transistor (MP7) electrically connecting a gate of the NMOS transistor of the second pair of PMOS and NMOS transistors to a drain of the first or the second input PMOS transistors (PM1, PM2) of the input stage; and a fourth pair of NMOS transistors (MN7, MN8) cross-coupled between the input stage and the output driving stage;

amplifying the differential input voltages by the input stage and the output driving stage to create amplified differential output voltages; and outputting the amplified differential output voltages to the first and the second differential output nodes.

\* \* \* \* \*